(12) United States Patent
Epitaux (10) Patent No.: US 7,180,650 B2
(45) Date of Patent: Feb. 20, 2007

(54) ELECTROMECHANICAL DRIVES ADAPTED TO PROVIDE THREE DEGREES OF MOBILITY

(75) Inventor: Marc Epitaux, Newark, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/092,011

(22) Filed: Mar. 29, 2005

(65) Prior Publication Data

US 2006/0245027 A1    Nov. 2, 2006

(51) Int. Cl.
*G02B 26/00* (2006.01)

(52) U.S. Cl. ..................................... 359/290

(58) Field of Classification Search ............ 359/290, 359/291, 292, 223, 224, 320, 322, 871, 872, 359/873; 385/16, 18; 310/309; 73/514.18
See application file for complete search history.

(56) References Cited

U.S. PATENT DOCUMENTS 6,546,801 B2 *   4/2003   Orsier et al. ............. 73/514.38
7,031,041 B2 *   4/2006   Mi et al. .................... 359/224
2002/0136485 A1   9/2002   Reed

FOREIGN PATENT DOCUMENTS

EP      1 325 885 A2    7/2003
EP      1 325 885 A3    12/2004

OTHER PUBLICATIONS

U.S. Appl. No. 10/832,598, filed Apr. 27, 2004, Epitaux et al.
U.S. Appl. No. 10/832,655, filed Apr. 27, 2004, Epitaux et al.
U.S. Appl. No. 11/026,259, filed Dec. 30, 2004, Epitaux.
U.S. Appl. No. 10/857,097, filed May 28, 2004, Epitaux.

* cited by examiner

*Primary Examiner*—Hung Xuan Dang
*Assistant Examiner*—Tuyen Tra
(74) *Attorney, Agent, or Firm*—Blakely, Sokoloff, Taylor & Zafman LLP (57) ABSTRACT

An apparatus for providing three degrees of mobility in an electromechanical drive arrangement comprises a substrate base, two or more micro-drives coupled to the substrate base, two or more suspension leg pairs, each suspension leg pair coupled to a micro-drive, and each suspension leg including articulations disposed on either end of the suspension leg to provide two-direction rotational capability, and a platform coupled to the two or more suspension leg pairs to move in a first, second, and third degree of mobility in response to complimentary activation of the two or more micro-drives.

20 Claims, 7 Drawing Sheets

ELECTROMECHANICAL DRIVES ADAPTED TO PROVIDE THREE DEGREES OF MOBILITY

FIELD OF THE INVENTION

The present embodiments of the invention relate generally to micro-electromechanical systems (MEMS), and, more specifically, relate to electromechanical drive arrangements.

BACKGROUND

Advances in photolithography processes have enabled electromechanical systems, for example microelectromechanical systems (MEMS), to have extremely small features. It is not uncommon for these features to have dimensions in the order of micrometers. Because the integrated fabrication process does not involve direct manual modification and assembly, device fabrication may be extremely efficient and reliable. Furthermore, the photolithography process has enabled individual components to have extremely uniform geometry and performance, a major advantage in contrast to hand-assembled instruments. As a result, it has become possible to insert MEMS into a variety of applications.

As an example, pressure sensors are being integrated with automotive tires to provide real time monitoring of tire pressure, micro-machined drug delivery systems are being considered for use as implantable smart drug capsules, micro-inertia sensors are being used for smart projectiles to automatically adjust trajectory for gun jump and wind factors, and micro-machined digital propulsion is finding applications in controlling the position of micro-satellites.

Additionally, micromechanical structures and active components are integrated with electronic components (such as signal processing circuits), sensors (temperature, pH), optics, fluid components (such as fluid channels, micro-pumps, and micro-valves), and high-performance chemical analytical systems (such as electrophoresis) to realize comprehensive functional integration in "smart" sensors and actuators.

Some of these micro-mechanisms are dedicated to displacing an accurately integrated mobile part. Technology has advanced to a point where mobile micro-mechanisms with one or two dimension linear translation motion capability have been provided. However, providing for three dimension linear translation motion capabilities has proved more difficult.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

An apparatus and method to provide three degrees of mobility in an electromechanical drive arrangement are described. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In the following description, numerous details are set forth. It will be apparent, however, to one skilled in the art, that the embodiments of the invention may be practiced without these specific details. In other instances, well-known structures and devices are shown in block diagram form, rather than in detail, in order to avoid obscuring the present invention.

Figure 1:
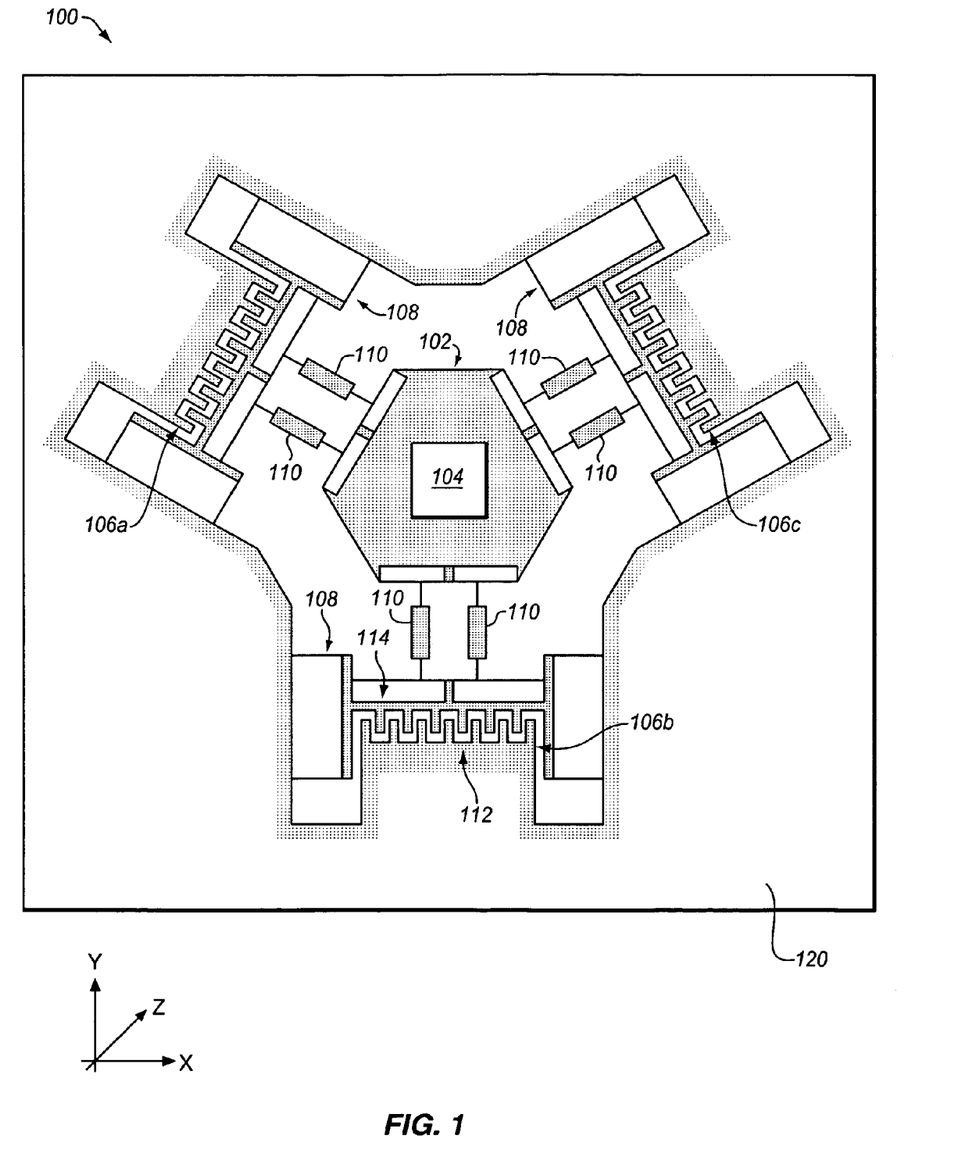
FIG. 1 illustrates a top view of a MEMS with a micro-drive arrangement with three degrees of mobility, according to one embodiment.

Referring to FIG. 1, a top view of a MEMS having a drive arrangement to provide three degrees of mobility, in accordance with one embodiment is shown. As illustrated, for the embodiment, MEMS 100 includes a substrate base 120, platform 102, object 104, and a drive arrangement including micro-drives 106a–106c. Platform 102 may hold object 104, which may include any variety of MEMS devices. Such MEMS devices include, but are not limited to, a micro-gripper, micro-lens, micro-mirror, and micro-sensor. One skilled in the art will appreciate that a variety of MEMS devices may be used advantageously with embodiments of the present invention.

As will be described in more detail below, micro-drives 106a–106c selectively cooperate with one another to provide platform 102 with three degrees of mobility. More specifically, for one embodiment, a first degree of mobility along the X direction, a second degree of mobility along the Y direction, and a third degree of mobility along the Z direction are provided.

Micro-drives 106a–106c may be, in one embodiment, comb drives. Each comb drive includes a first comb structure 112 fixed to the substrate base 120. Each comb drive also includes a second comb structure 114 that is detached from the MEMS substrate and movably suspended by two or more compliant suspension beams 108.

In other embodiments, micro-drives 106a–106c may be based on other physical means. One skilled in the art will appreciate that different actuation principles may be used to induce the desired displacement of micro-drives 106a–106c, such as electrostatic, electromagnetic, piezoelectrical bimorph, and thermal bimorph principles.

The two or more compliant suspension beam 108 are coupled on one end to a micro-drive 106a–106c. The other ends of the two or more compliant suspension beams 108 are movably attached to the MEMS substrate base 120. In one embodiment, the two or more compliant suspension beams 108 are the same length and width to create a parallelogram structure between the compliant suspension beams 108. Such a parallelogram structure allows the movements of the platform to be translational movements and prevents rotational movements of the platform.

Compliant suspension beams 108 guide the micro-drives 106a–106c with an interlacement of the first comb structure 112 and the second comb structure 114 that avoids any transverse motion of the comb structures 112, 114 that may generate actuator short-circuit and stiction.

Continuing to refer to FIG. 1, MEMS 100 further includes suspension legs 110 coupled to micro-drives 106a–106c. As depicted, a pair of suspension legs 110 is attached to each micro-drive 106a–106c. This "parallel" structure of the suspension legs limits the movement of platform 102 to three translations in the X, Y, and Z directions. Furthermore, this structural arrangement results in the platform 102 remaining parallel to the substrate base 120 through all displacements of the micro-drives 106a–106c. In this way, platform 102 may not perform any undesirable rotational movements.

MEMS 100 in FIG. 1 provides a drive arrangement to produce three degrees of mobility by utilizing the three micro-drives 106a–106c with two suspension legs 110 coupled to each micro-drive 106a–106c, for a total of six suspension legs 110 employed. In one embodiment, the micro-drives 106a–106c may be aligned with 60° degree angles in relation to one another. It is envisioned that other arrangements of micro-drives and suspension legs may also produce the same result, and embodiments of the present invention are not necessarily limited to this particular implementation.

MEMS 100 may be utilized in a variety of applications. Such applications include, but are not limited to, a platform for optimizing optoelectronic optical coupling efficiency (such as a movable lens), an optical beam scanner for optical far-field, display or imaging technology such as a scanning lens to scan surfaces, micro-XYZ positioner/stage for scanning probes (for example, tip on mass), and microscopy such as atomic-force microscopy or optical imaging microscopy where a high numerical aperture (NA) lens is in close contact to a surface.

Figure 2:
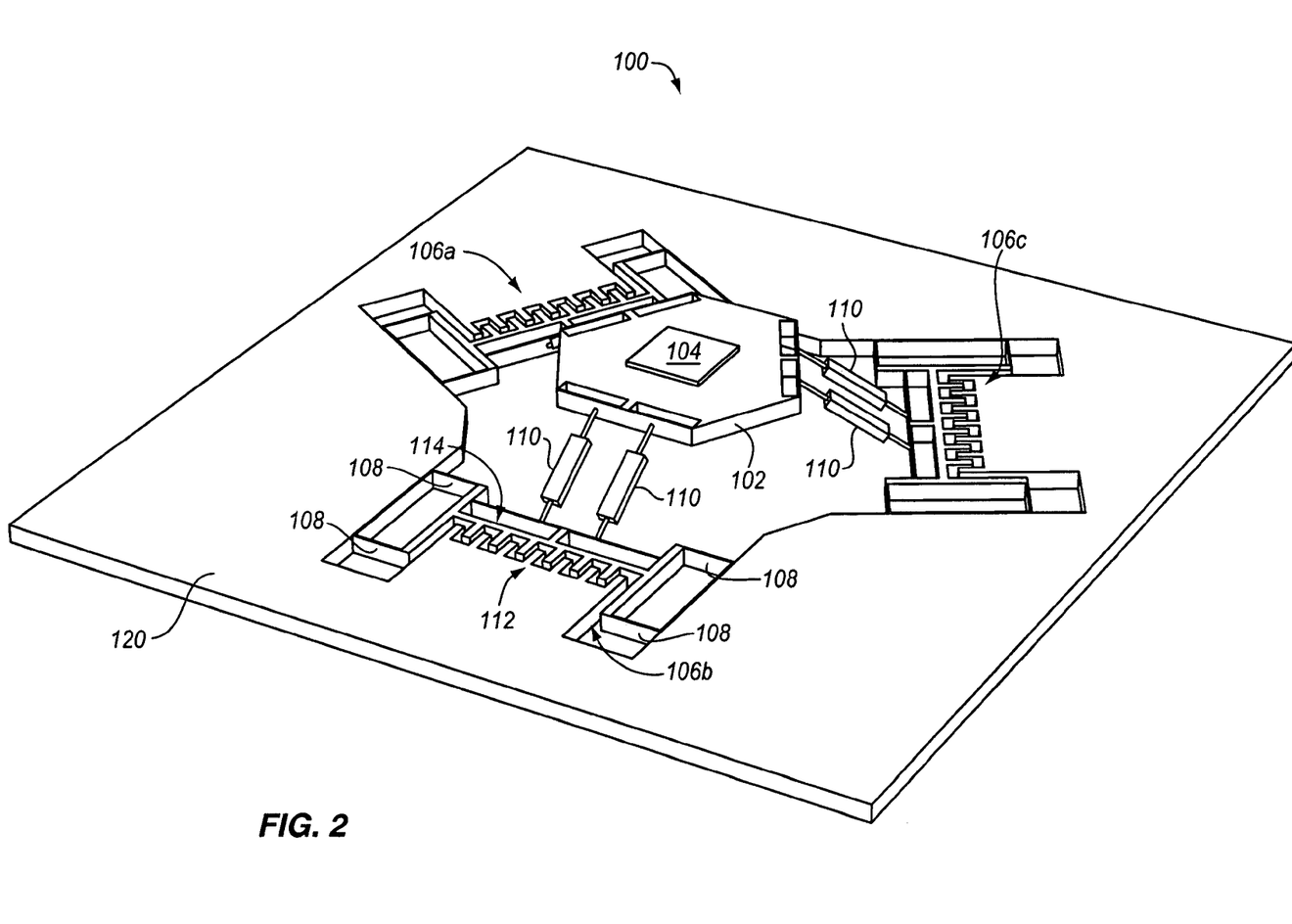
FIG. 2 illustrates another view of a MEMS with a micro-drive arrangement with three degrees of mobility, according to one embodiment.

Referring to FIG. 2, an angled view of the MEMS 100 of FIG. 1 is presented. This figure more clearly illustrates the 3D-nature of embodiments of the present invention. FIG. 2 depicts platform 102 suspended by suspension legs 110 on a different plane than that occupied by the substrate base 120 and micro-drives 106a–106c. However, the arrangement of suspension legs 110 results in the platform 102 remaining parallel to the substrate base 102 throughout any movements of the suspension legs created by micro-drives 106a–106c.

Figure 3:
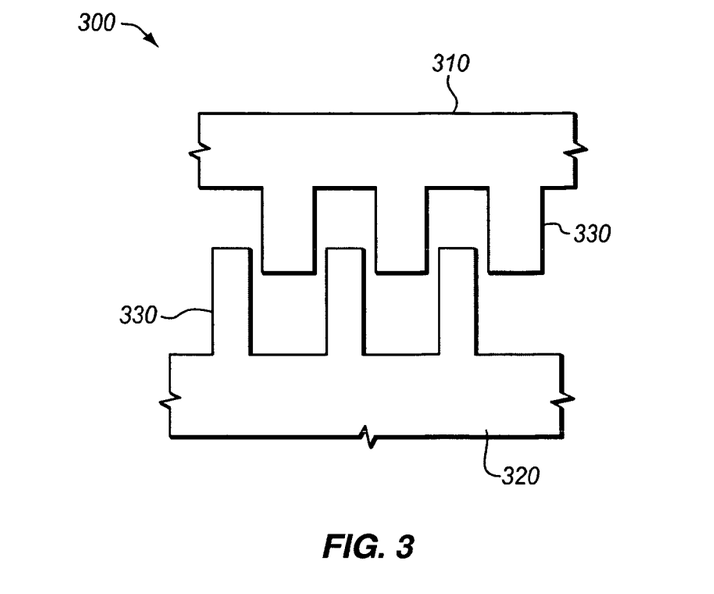
FIG. 3 illustrates a zoom-in view of one embodiment of micro-drive.

Referring now to FIG. 3, where a zoom-in view of a micro-drive, in accordance with various embodiments, is shown. Micro-drive may be, in some embodiments, the same as any one of micro-drives 106a–106c as depicted in FIG. 1. Micro-drive is a comb drive 300 including two portions 310, 320. Each portion 310, 320 has a number of fingers 330. One of the two portions 320 is substantially "affixed" to a substrate, such as substrate base 120 of FIG. 1, and the other portion 310 is coupled to one end of a compliant suspension beam, such as compliant suspension beam 108 of FIG. 1.

In various embodiments, comb drive 300 operates in accordance with electrostatic principles. That is, when movement is desired of the comb drive 300, fingers 330 of the two portions 310, 320 are complementarily energized, causing the portion 310 of the comb drive coupled to one end of a compliant suspension beam to linearly move towards the substantially "affixed" portion 320. In other embodiments, the micro-drive may also provide line movement away from the substrate according to other actuation principles. Accordingly, the portion 320 coupled to the substrate may be referred to as the "fixed" portion of the comb drive 300, while the portion 310 coupled to one end of the compliant suspension beam may also be referred to as the "movable" portion of the comb drive 300.

Further, in each case, the amount of movement is substantially dependent on the amount of displacement of the "moveable" portion 310 towards the "fixed" portion 320, which is dependent on the level portions 310, 320 are energized. In other words, by controlling the level portions 310, 320 are energized, the distances moved by micro-drives, such as micro-drives 106a–106c of FIG. 1, and therefore micro-object 104, may be controlled. In various embodiments, the level portions 310, 320 of micro-drives 106a–106c may be energized in variable, and may differ from each other.

Figure 4:
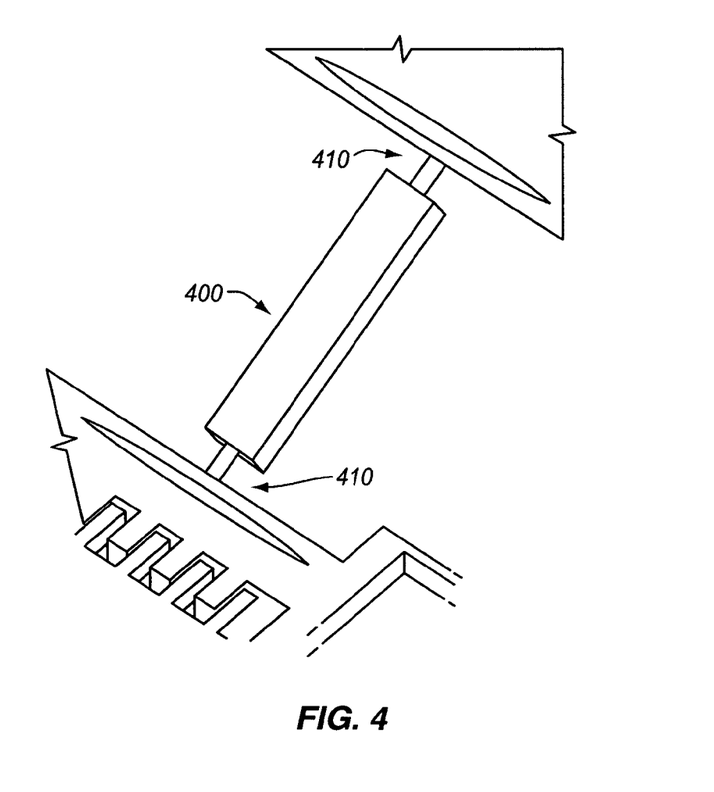
FIG. 4 illustrates a zoom-in view of one embodiment of a suspension leg.

Referring now to FIG. 4, wherein a zoom-in view of a suspension leg, in accordance with various embodiments, is shown. Suspension leg 400, may, in some embodiments, be the same as suspension legs 110, as depicted in FIG. 1. In one embodiment, suspension leg 400 is coupled to the micro-drive and the platform with two articulations, one articulation on the micro-drive structure and one articulation on the platform. The articulations allow the movement of suspension leg 400 in response to displacement by a micro-drive, such as any of micro-drives 106a–106c of FIG. 1.

In order to achieve translations in each of the X, Y, and Z directions, each of the articulations should satisfy two degrees of rotations. For nanometer accuracy, every articulation is based on the compliance and flexibility of the structure. Therefore, the suspension leg 400 is terminated with a thin "T-shape" compliant beam 410. The T-shape compliant beam 410 allows a bending of the vertical portion of the compliant beam 410. It also allows torsion of the horizontal portion of the compliant beam 410. Other embodiments of the invention may generally utilize any other compliant structure that generates a two-rotation articulation.

Figure 5A:
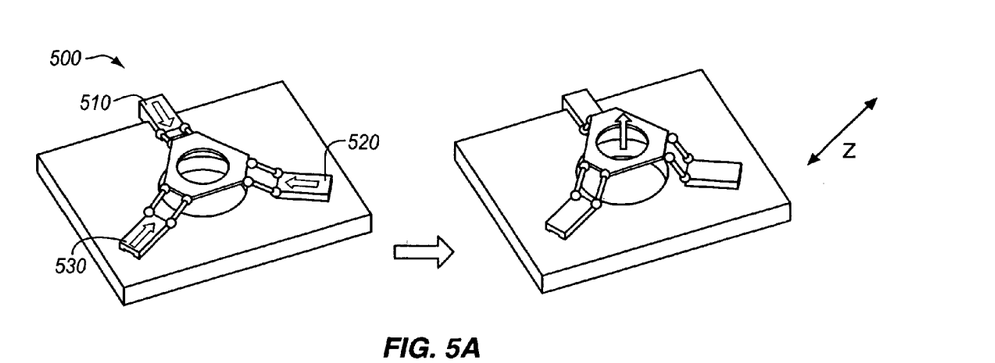
FIG. 5A illustrates one embodiment of a MEMS performing a translation in the Z direction.
Figure 5B:
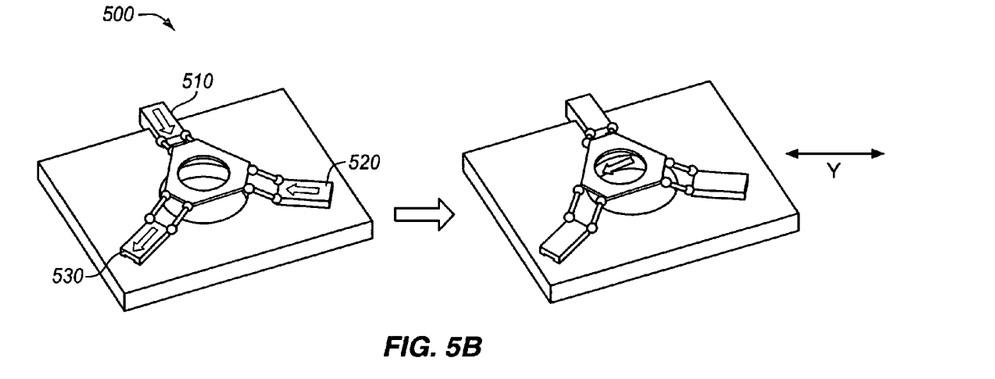
FIG. 5B illustrates one embodiment of a MEMS performing a translation in the Y direction.
Figure 5C:
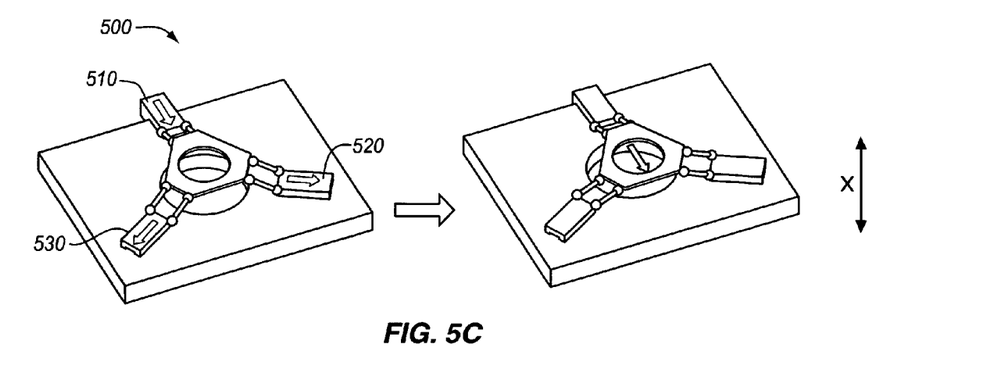
FIG. 5C illustrates one embodiment of a MEMS performing a translation in the X direction.

Referring to FIGS. 5A, 5B, and 5C, wherein translations in the X, Y, and Z directions, in accordance with various embodiments, are depicted. Each of the figures depicts a MEMS 500, with various displacements among its micro-drives 510, 520, 530, and the resultant translation such displacements produce. In some embodiments, MEMS 500 may be the same as MEMS 100, as described with respect to FIG. 1.

FIG. 5A depicts a translation in the Z direction. Z motions are generated by equal displacement of the micro-drives toward the center, or equal displacement of the micro-drives away from the center. In one embodiment, a displacement by micro-drives 510, 520, 530 toward the center of MEMS 500 will produce a translation upward in the Z direction, as depicted in this figure.

FIG. 5B depicts a translation in the Y direction. The Y direction motion is generated by a combination of displacements by the micro-drives 510, 520, 530. In one embodiment, a displacement by micro-drives 510 and 520 toward the center of the MEMS 500, with an equal displacement by micro-drive 520 away from the center of the MEMS 500 will produce a translation in the Y direction, as depicted in this figure.

FIG. 5C depicts a translation in the X direction. The X direction motion is generated by a combination of displacements by the micro-drives 510, 520, 530. In one embodiment, a displacement by micro-drive 510 toward the center of the MEMS 500, with an equal displacement by micro-drives 520 and 530 away from the center of the MEMS 500 will produce a translation in the X direction, as depicted in this figure.

In various embodiments, one or more regions of the substrate 120 may be energized to attract the platform 102, thereby effectuating a desired holding or locking in-place function for holding or locking the platform 102, and therefore the object 104 disposed on the platform 102 in place, after the platform 102 (and the object 104) have been moved to a desired position (for example, operational) location/position. In alternative embodiments, the holding or lock down function may be effectuated employing other physical principles, including but not limited to electromagnetic, piezoelectrical bimorph, thermal bimorph, and so forth.

The holding or lock down feature is useful in, for example, a microlens application (where the object 104 is a microlens), for holding or locking the microlens in place, after it has been moved into a desired operational location, such as a location where it is in alignment with a light source and an optical fiber. This operation may be performed post assembly or after substantial completion of an assembly of an optoelectronic module having MEMS 100.

Further, at a later point in time, the holding or locking may be undone, to render the microlens to be moveable again after the re-alignment. The unlocking and realignment may be desired due to a change in operational requirements or the elements being misaligned. The unlocking, realignment, and relocking process may be repeated any number of times as needed. Note that the process of operationally positioning a micro-object, locking the micro-object in place, unlocking it and repeating the positioning and locking process is not limited to the microlens application. The practice may be applied to a wide range of other micro-objects where operational repositioning relative to other elements is desired.

Figure 6:
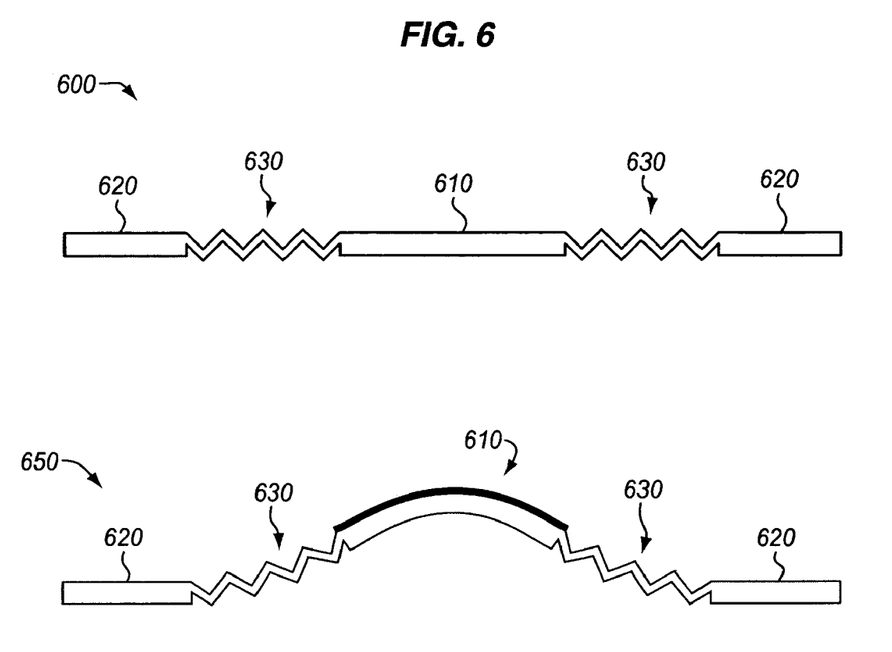
FIG. 6 illustrates one embodiment of a MEMS during the fabrication process.

Referring now to FIG. 6, wherein a side view of a MEMS, such a MEMS 100 depicted in FIG. 1, is shown. MEMS are fabricated in a single plane, as shown by MEMS 600. The platform 610 of MEMS 600 may be moved out of the plane of the base 620 of the MEMS. If the platform 610 remains in the same plane as the base 620 of MEMS, then the suspension legs 630 may be in a position where they move in either an upward or downward direction upon displacement of the micro-drives.

In one embodiment, in order to force the suspension legs 630 to only move in an upward direction, a thin film deposit or sputtering is applied to the platform 610 during fabrication of the MEMS. This thin film deposit pre-stresses and slightly bows the platform 610, thereby placing it out of the plane of the base 620. In one embodiment a Pb (Zr, Ti) O3 is used as the thin film deposit. A MEMS 650 after application of the thin film deposit is shown.

Figure 7:
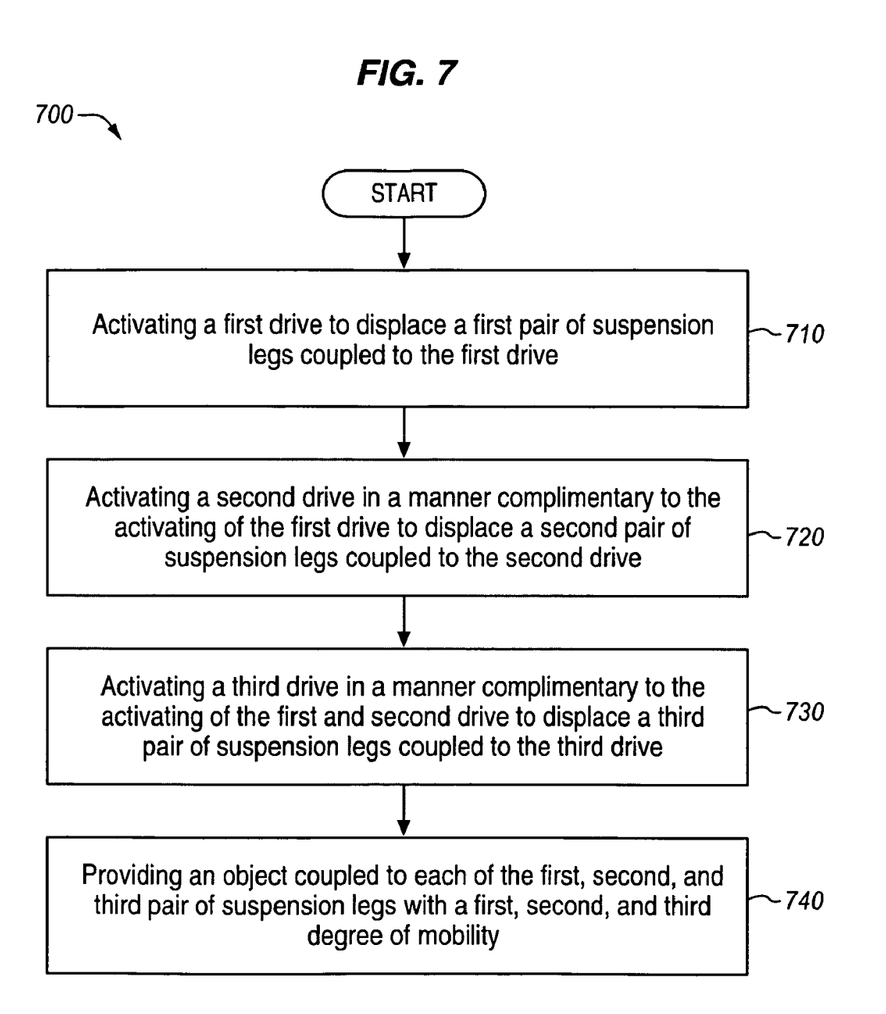
FIG. 7 is a flow diagram depicting one embodiment of a method to provide three degrees of mobility in a MEMS.

Referring to FIG. 7, wherein a flow diagram depicting a method according to one embodiment of the present invention is shown. At processing block 710, a first drive is activated to displace a first pair of suspension legs coupled to the first drive. At processing block 720, a second drive is activated in a manner complimentary to the activating of the first drive, to displace a second pair of suspension legs coupled to the second drive.

Then, at processing block 730 a third drive is activated in a manner complimentary to the activating of the first and second drives to displace a third pair of suspension legs coupled to the third drive. Embodiments of the invention may operate so that process blocks 710, 720, and 730 occur simultaneously. At processing block 740, an object coupled to each of the first, second, and third pair of suspension legs is provided with a first, second, and third degree of mobility due to the activation of the first, second, and third drives.

Figure 8:
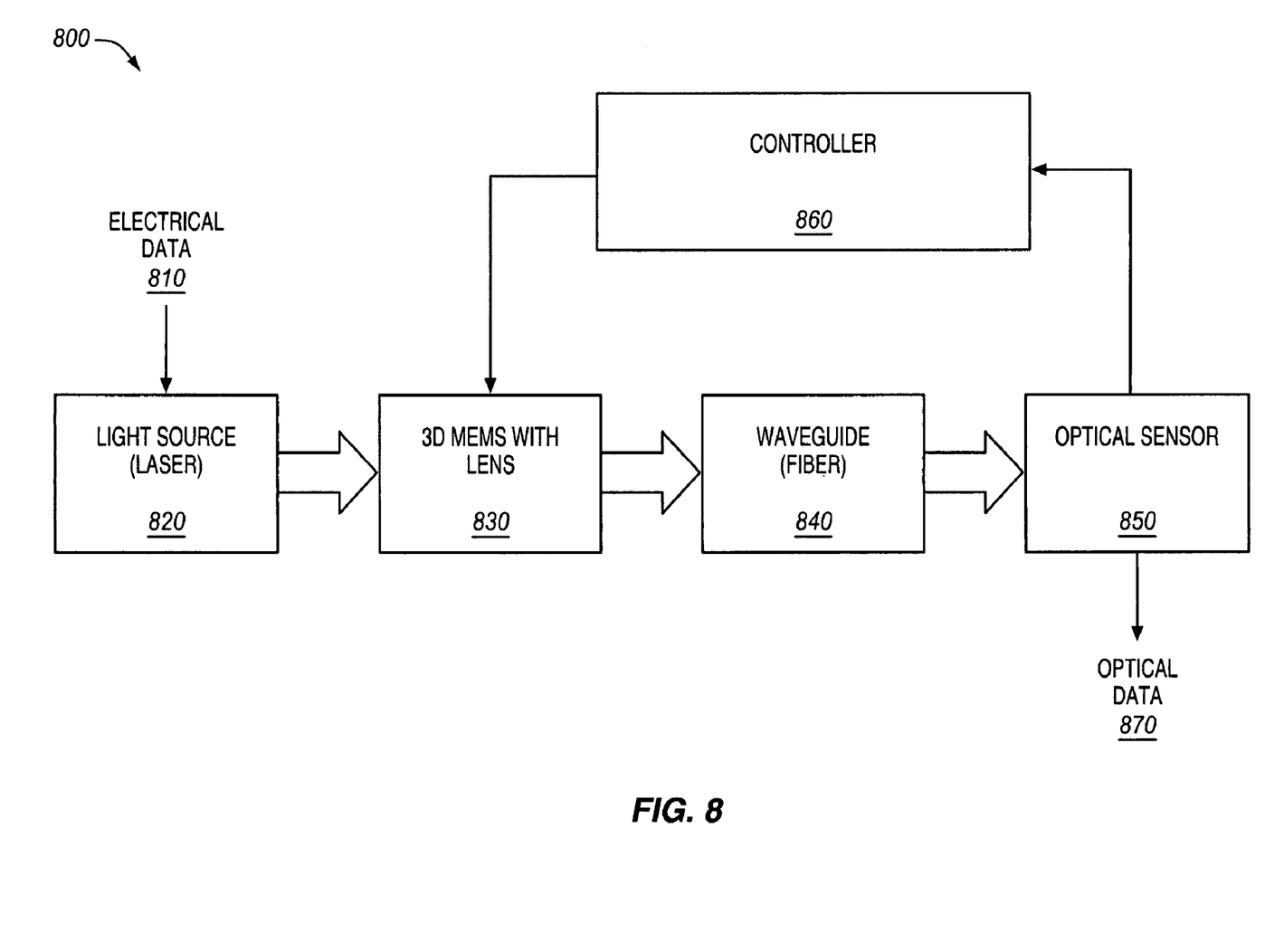
FIG. 8 illustrates a block diagram of a system according to one embodiment of the invention.

Referring now to FIG. 8, wherein an example optical system to utilize embodiments of the present invention, is shown. As illustrated, system 800 is an optical transmitter with a 3D MEMS scanner that may utilize the drive arrangement of embodiments of the present invention to provide three degrees of mobility to the 3D MEMS. System 800 includes light source 820, 3D MEMS 830, waveguide or fiber 840, optical sensor 850, and controller 860, as shown.

Electronic data 810 is feed to a light source 820, such as a laser diode, that converts the electrical impulse into an optical impulse. The pulsed light emitted by the light source 820 transmits the light to a 3D MEMS 830 containing a lens. The 3D MEMS 830 transmits and focuses the light to a waveguide 840. Waveguide 840 may be a fiber. The waveguide or fiber 840 transmits light to an optical sensor 850. Optical sensor outputs optical data 870.

For sufficient light power and signal-to-noise ratio, the lens alignment of the 3D MEMS 830 should be optimized to transmit the maximum light to the waveguide or fiber 840. In order to do this, the 3D MEMS 830 that includes the lens may move and steer the light beam to the core of the waveguide or fiber 840 to maximize coupling efficiency.

To determine the optimum alignment of 3D MEMS 830, the controller 860 of the optical system 800 drives the 3D MEMS 830 based on optical feedback provided by the optical sensor 850. The optical feedback is determined by sensing the light injected into the waveguide or fiber 840, and thereby drives the 3D MEMS 830 to optimize the lens position.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the invention.

What is claimed is:

1. An apparatus, comprising:
   a substrate base;
   two or more micro-drives coupled to the substrate base;
   two or more suspension leg pairs, each suspension leg pair coupled to a micro-drive, and each suspension leg including articulations disposed on either end of the suspension leg to provide two-direction rotational capability; and
   a platform coupled to the two or more suspension leg pairs to move in a first, second, and third degree of mobility in response to complimentary activation of the two or more micro-drives.

2. The apparatus of claim 1, wherein the two or more micro-drives are comb-drives including:
   a first structure coupled to the substrate base; and
   a second structure coupled to a suspension leg pair and movably suspended from two or more compliant suspension beams.

3. The apparatus of claim 2, wherein the two or more compliant suspension beams are movably attached to the substrate base.

4. The apparatus of claim 2, wherein the first structure and the second structure are complementarily energized to linearly displace the second structure in relation to the first structure.

5. The apparatus of claim 4, wherein the two or more suspension leg pairs are displaced in response to the linear displacement of the second structure to provide the platform with the first, second, and third degree of mobility.

6. The apparatus of claim 1, wherein each suspension leg is terminated by a compliant structure to allow for bending and torsion in response to activation of the two or more micro-drives.

7. The apparatus of claim 1, further comprising an object disposed on the platform.

8. The apparatus of claim 7, further comprising one or more features adapted to attract and hold the platform, rendering the object unmovable by the two or more micro-drives.

9. The apparatus of claim 1, wherein a thin film deposit is applied to the platform to pre-stress and bow the platform into a different plane than a plane of the substrate base where the two or more micro-drives are disposed.

10. A method, comprising:
activating a first drive to displace a first pair of suspension legs coupled to the first drive;
activating a second drive in a manner complimentary to the activating of the first drive to displace a second pair of suspension legs coupled to the second drive;
activating a third drive in a manner complimentary to the activating of the first drive and the second drive to displace a third pair of suspension legs coupled to the third drive; and
providing an object coupled to the first, second, and third pair of suspension legs with a first, second, and third degree of mobility due to the activation of the first, second, and third drives.

11. The method of claim 10, wherein the activating of the first, second, and third drives is performed simultaneously.

12. The method of claim 11, wherein the activating of the first, second, and third drives is performed to provide a selected one of the first, second, and third degrees of mobility.

13. The method of claim 11, wherein the first, second, and third drives are comb drives including:
a first structure coupled to a substrate base; and
a second structure coupled to a suspension leg pair and movable suspended from two or more compliant suspension beams.

14. The method of claim 13, wherein the first structure and the second structure are complementarily energized to displace the second structure in relation to the first structure.

15. A system, comprising:
a controller to provide feedback based on light injected into a waveguide; and
an electromechanical system to receive the light from a light source and transmit the light to the waveguide based on the feedback, and further including an electromechanical subsystem having:
a substrate base;
two or more micro-drives coupled to the substrate base;
two or more suspension leg pairs, each suspension leg pair coupled to a micro-drive, and each suspension leg including articulations disposed on either end of the suspension leg to provide two-direction rotational capability; and
a platform to hold a lens to receive the light coupled to the two or more suspension leg pairs to move in at least one of a first, second, and third degree of mobility in response to complimentary activation of the two or more micro-drives.

16. The system of claim 15, wherein the two or more micro-drives are comb drives including:
a first structure coupled to the substrate base; and
a second structure coupled to a suspension leg pair and movably suspended from two or more compliant suspension beams.

17. The system of claim 16, wherein the two or more compliant suspension beams are movably attached to the substrate base.

18. The system of claim 17, wherein the first structure and the second structure are complementarily energized to linearly displace the second structure in relation to the first structure.

19. The system of claim 18, further comprising one or more features adapted to attract and hold the platform, rendering the lens unmovable by the two or more micro-drives.

20. The system of claim 15, wherein each suspension leg is terminated by a complaint structure to allow for bending and torsion in response to activation of the two or more micro-drives.

* * * * *

UNITED STATES PATENT AND TRADEMARK OFFICE
CERTIFICATE OF CORRECTION

| | |
|---|---|
| PATENT NO. | : 7,180,650 B2 |
| APPLICATION NO. | : 11/092011 |
| DATED | : February 20, 2007 |
| INVENTOR(S) | : Epitaux |

It is certified that error appears in the above-identified patent and that said Letters Patent is hereby corrected as shown below:

Title Page;

In (75), at line 1 of the Inventors, delete "Newark" and insert --Sunnyvale--.

In column 2, at line 63, delete "beam" and insert --beams--.

In column 3, at line 38, after "surfaces," insert --a--.

In column 4, at line 19, delete "in" and insert --is--.

Signed and Sealed this

Twenty-fourth Day of June, 2008

JON W. DUDAS
*Director of the United States Patent and Trademark Office*